(12) United States Patent
Tseng et al.

(10) Patent No.: US 7,994,576 B2
(45) Date of Patent: Aug. 9, 2011

(54) METAL GATE TRANSISTOR AND RESISTOR AND METHOD FOR FABRICATING THE SAME

(75) Inventors: Chih-Yu Tseng, Hsinchu (TW);
Chien-Ting Lin, Hsin-Chu (TW);
Kun-Szu Tseng, Pingtung County (TW);
Cheng-Wen Fan, Tainan County (TW);
Victor-Chiang Liang, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 31 days.

(21) Appl. No.: 12/488,592

(22) Filed: Jun. 22, 2009

(65) Prior Publication Data
US 2010/0320544 A1    Dec. 23, 2010

(51) Int. Cl.
*H01L 27/01* (2006.01)
*H01L 27/12* (2006.01)
*H01L 23/62* (2006.01)
*H01L 31/0392* (2006.01)
*H01L 29/76* (2006.01)

(52) U.S. Cl. ......... 257/350; 257/379; 257/380; 257/358

(58) Field of Classification Search .................. 257/133, 257/350, 380, 388, 379, 154, 359, 385, 538, 257/904, 358, 363, 381, 516, 533, 536, 543, 257/577, 582
See application file for complete search history.

(56) References Cited

U.S. PATENT DOCUMENTS

| | | | |
|---|---|---|---|
| 6,162,584 A | 12/2000 | Chen | |
| 6,406,956 B1 | 6/2002 | Tsai | |
| 6,573,134 B2 | 6/2003 | Ma | |
| 7,084,478 B2* | 8/2006 | Lee et al. | 257/516 |
| 7,602,027 B2* | 10/2009 | Burke et al. | 257/379 |
| 2005/0148118 A1* | 7/2005 | Zheng et al. | 438/133 |
| 2007/0082440 A1* | 4/2007 | Shiratake | 438/243 |
| 2009/0236669 A1 | 9/2009 | Chen | |

* cited by examiner

*Primary Examiner* — Chuong A. Luu
(74) *Attorney, Agent, or Firm* — Winston Hsu; Scott Margo (57) ABSTRACT

A method for fabricating metal gate transistor and resistor is disclosed. The method includes the steps of: providing a substrate having a transistor region and a resistor region; forming a shallow trench isolation in the substrate of the resistor region; forming a tank in the shallow trench isolation of the resistor region; forming at least one gate in the transistor region and a resistor in the tank of the resistor region; and transforming the gate into a metal gate transistor.

8 Claims, 7 Drawing Sheets

METAL GATE TRANSISTOR AND RESISTOR AND METHOD FOR FABRICATING THE SAME

BACKGROUND OF THE INVENTION

1. Field of the Invention

The invention relates to a method for fabricating a metal gate transistor and resistor, and more particularly, to a method of forming a tank in the shallow trench isolation of the resistor region such that the top of the resistor is lower than the top of the metal gate transistor.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having high resistance, which causes the polysilicon gate to work under a much lower rate than other metal wires. In order to compensate for slightly lowered rate of performance, a significant amount of silicides is applied during the fabrication of polysilicon processes, such that the performance of the device could be increased to an acceptable level.

Gate electrodes fabricated by polysilicon also causes a depletion effect. In most circumstances, the optimum doping concentration for polysilicon is between about $2 \times 20^{20}/cm^3$ and $3 \times 10^{20}/cm^3$. As most gate electrodes have a doping concentration of at least $5 \times 10^{21}/cm^3$, the limited doping concentration of polysilicon gates often results in a depletion region at the interface between the gate and the gate dielectric layer. This depletion region not only thickens the gate dielectric layer, but also lowers the capacitance of the gate, and ultimately reduces the driving ability of the device.

In order to solve this problem, work function metal gates are used to replace conventional polysilicon to fabricate gate electrodes for MOS transistors. However, it is well known in the art that the degree of difficulty for fabricating a MOS transistor with work function metal gate is immense as the process often involves strict control for the thickness of material and balance of the ingredients, as well as complicated integration with other devices. Hence, how to successfully integrate the fabrication of a conventional work function metal gate transistor with other passive devices such as capacitors and resistors has become an important study in the field.

SUMMARY OF THE INVENTION

It is an objective of the present invention to provide a structure for integrating polysilicon resistor and metal gate transistor, and fabricating method thereof.

A method for fabricating metal gate transistor and polysilicon resistor is disclosed. The method includes the steps of: providing a substrate having a transistor region and a resistor region; forming a shallow trench isolation in the substrate of the resistor region; forming a tank in the shallow trench isolation of the resistor region; forming at least one polysilicon gate in the transistor region and a polysilicon resistor in the tank of the resistor region; and transforming the polysilicon gate into a metal gate transistor.

According to another aspect of the present invention, a transistor with metal gate is disclosed. The transistor preferably includes: a substrate having a transistor region and a resistor region; a shallow trench isolation disposed in the substrate of the resistor region;

a tank formed in the shallow trench isolation of the resistor region; a resistor disposed in the tank of the shallow trench isolation; and a metal gate transistor disposed on the substrate of the transistor region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
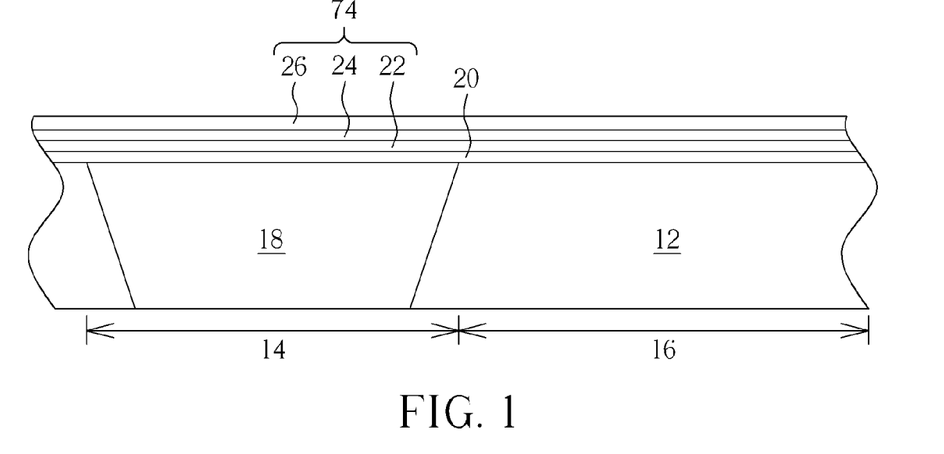
FIGS. 1-8 illustrate a method for integrating a polysilicon resistor and a metal gate transistor according to a preferred embodiment of the present invention.

Referring to FIGS. 1-8, FIGS. 1-8 illustrate a method for integrating a polysilicon resistor and a metal gate transistor according to a preferred embodiment of the present invention. As shown in FIG. 1, a substrate 12, such as a silicon substrate or a silicon-on-insulator (SOI) substrate is provided. A resistor region 14 and a transistor region 16 are defined on the substrate 12 and a shallow trench isolation 18 is formed in the substrate 12 of the resistor region 14. Fabrication of the shallow trench isolation 18 typically involves the following steps: selectively covering a buffer layer (such as a thin oxide) on the substrate 12 and disposing a hard mask (such as silicon nitride) thereafter; defining the shallow trench isolation 18 region through a photolithography process, and utilizing an etching process to form a recess in the substrate 12; forming an insulating material (such as silicon nitride) to fill the recess utilized for defining the shallow trench isolation 18; selectively conducting a thermal treatment under an oxygen-containing environment to increase the density of the insulating material while repairing the entire structure; planarizing the excess insulating material through a chemical mechanical polishing (CMP) process to expose the substrate 12; and removing the hard mask. Typically, the top surface of the shallow trench isolation 18 obtained after removing the hard mask is substantially higher than the top surface of the substrate 12. For illustration purpose, this height difference is not revealed in the following figures. However, it should be noted that the top surface of the shallow trench isolation 18 would change throughout the fabrication process.

A gate insulating layer 20 composed of dielectric material such as oxides or nitrides is selectively deposited on the surface of the substrate 12 and a stacked film 74 composed of a high-k dielectric layer 22, a cap layer 24, and a metal layer 26 is deposited on the gate insulating layer 20 thereafter. Despite the gate insulating layer 20 in this embodiment is a single layer structure, the gate insulating layer 20 could also be composed of multiple of layers, such as a stacked structure having an oxide layer and the aforementioned high-k dielectric layer 22. In this embodiment, the high-k dielectric layer 22 is preferably composed of HfSiO, HfSiON, HfO, LaO, LaAlO, ZrO, ZrSiO, HfZrO, or combination thereof, the cap layer 24 is composed of LaO, $Dy_2O_3$, or combination thereof, and the metal layer 26, depending on the type of transistor being fabricated, could be composed of n-type work function metal or p-type work function metal. For instance, if the transistor fabricated in the transistor region 16 is a NMOS transistor, the metal layer 26 is preferably composed of n-type metal such as TiN, TaC, Ta, TaSiN, Al, TiAlN, Ta, Ti, Hf, or combination thereof. If the fabricated transistor is a PMOS transistor, the metal layer 26 is preferably composed of p-type metal such as TiN, W, WN, Pt, Ni, Ru, TaCN, or TaCNO.

Figure 2:
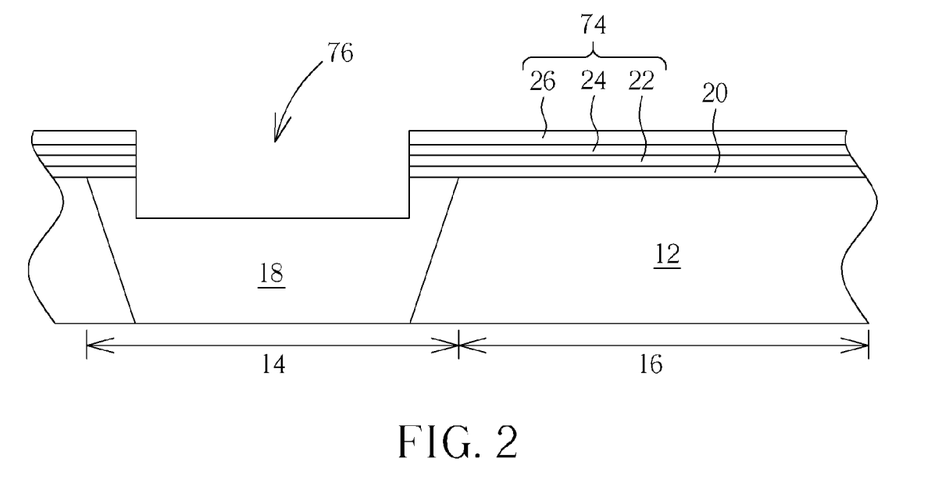

As shown in FIG. 2, a portion of the stacked film 74 is removed selectively. For instance, a patterned photoresist (not shown) is formed on the surface of the stacked film 74 while exposing the region where the tank 76 is to be formed, and an etching process is conducted by using this patterned photoresist as a mask to remove a portion of the stacked film 74 in the resistor region 14 and a portion of the shallow trench isolation 18 under the stacked film 74. This forms a tank 76 in the shallow trench isolation 18 of the resistor region 14. The etching process used to form the tank 76 could be a dry etching process, a wet etching process, or combination thereof, and this etching process could be a single etching process (conducted in the same equipment) or a combination of series of etching processes (such as conducted in same or different equipment). The patterned photoresist is stripped after the tank 76 is formed.

Figure 3:
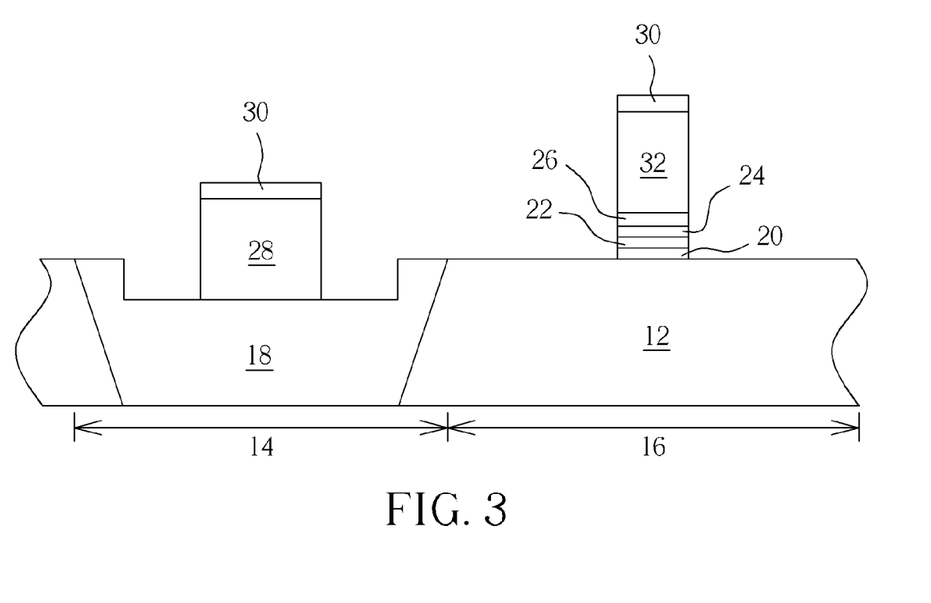

As shown in FIG. 3, a polysilicon layer (not shown) and a hard mask (not shown) is formed entirely on the stacked film 74, and another patterned photoresist (not shown) is formed on the hard mask thereafter. A pattern transfer is performed by using the patterned photoresist as mask to remove a portion of the hard mask, polysilicon layer, and stacked film 74 through single etching or series of etching processes. After stripping the patterned photoresist, a patterned hard mask 30 and a polysilicon resistor 28 composed of patterned polysilicon layer are formed in the resistor region 14, and a patterned hard mask 30 and a gate 32 composed patterned polysilicon layer are formed in the transistor region 16. It should be noted that polysilicon spacers caused by polysilicon remains could be formed at corners of the tank 76. For illustration purpose, this feature is not revealed in the figures, however the distance between the resistor 28 and edge of the tank 76 should be well controlled to prevent merge of the resistor 28 and the polysilicon spacers and result in a resistance much higher than the specification. In this embodiment, the polysilicon resistor 28 and the gate 32 could be composed undoped polysilicon material, polysilicon containing n+ or p+ dopants, or other semiconductor or conductive material, and the hard mask 30 is composed of $SiO_2$, SiN, SiC, SiON, or combination thereof.

Figure 4:
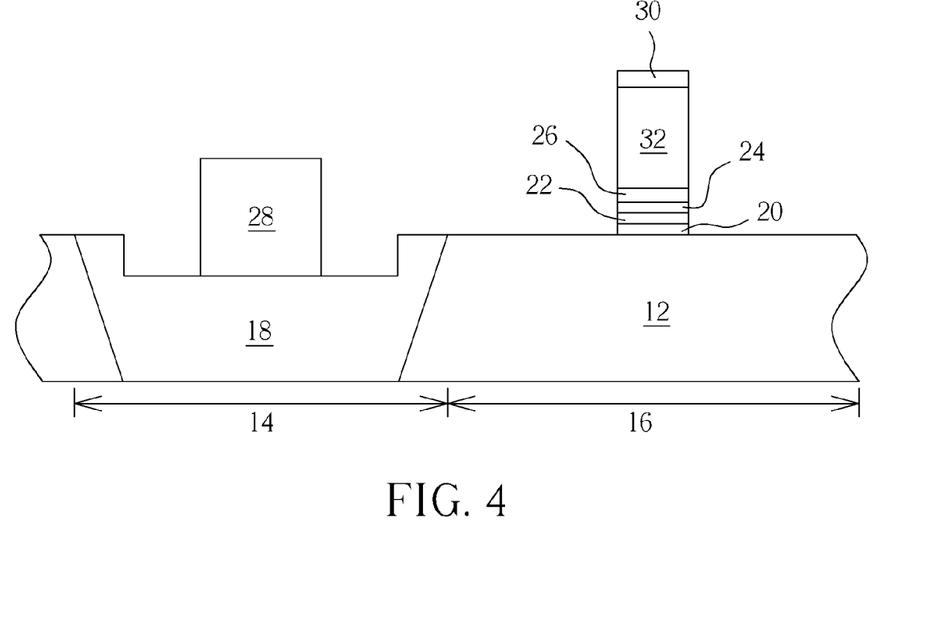

As shown in FIG. 4, another etching process is conducted by using the same patterned photoresist (not shown) used for forming the tank 76 as mask to expose only the region of the tank 76 and remove the hard mask 30 disposed on top of the polysilicon resistor 28. It should be noted that as the hard mask 30 is removed, the fabrication parameters for the etching process could be adjusted to over-etch the polysilicon layer underneath the hard mask 30. By adjusting the height and cross-sectional area of the polysilicon resistor 28 through the above over-etching process, the resistance of the polysilicon resistor could be controlled effectively. Moreover, as the shallow trench isolation 18 is composed of dielectric material, the portion of the shallow trench isolation 18 not covered by the resistor 28 may be etched by the etchant and collapse while the hard mask 30 is removed from the resistor region 14. In order to reduce the complexity of the figures, this feature is not presented in FIG. 4.

Figure 5:
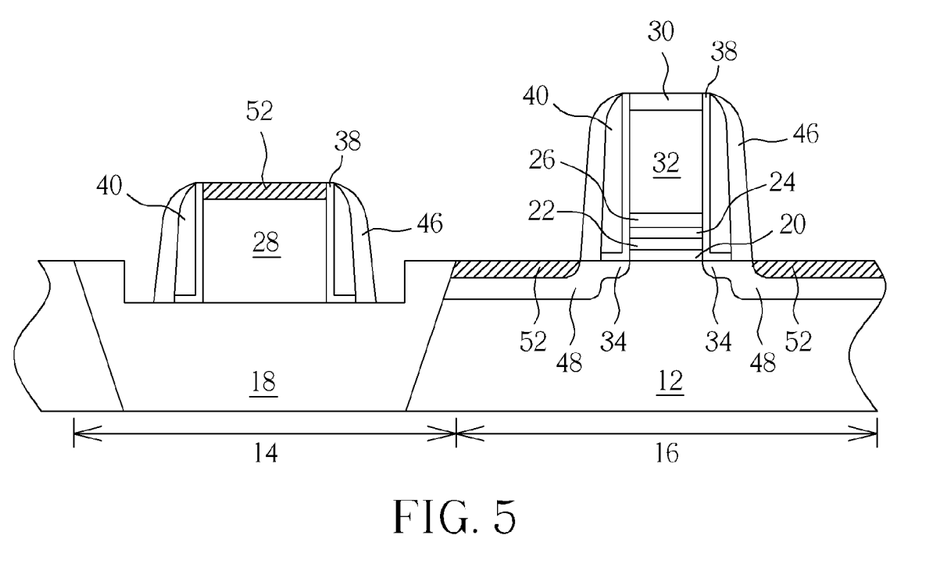

As shown in FIG. 5, a light doping process is performed selectively to form a lightly doped drain 34. For instance, a patterned photoresist (not shown) could be formed on regions not intended to undergo doping process, and an ion implantation process is conducted by using this patterned photoresist as mask to implant n-type or p-type dopants into the substrate 12 at two sides of the gate 32 of the transistor region 16 to form a lightly doped drain 34.

Next, a first stage spacer formation is conducted by oxidizing the surface of the polysilicon resistor 28 and gate 32 or through deposition process to form a silicon oxide layer 38, depositing a silicon nitride layer 40 and back-etching the silicon nitride layer 40 to form a spacer composed of silicon oxide layer 38 and silicon nitride layer 40 on the sidewall of the polysilicon resistor 28 and the polysilicon gate 32. A second stage spacer formation is conducted thereafter to form a spacer 46 composed of silicon oxide on the silicon nitride 40 of the resistor region 14 and the transistor region 16. A light ion implantation could be inserted between the first stage spacer formation and the second stage formation to form a second lightly doped drain (not shown), which is also within the scope of the present invention.

A heavy doping process is conducted to form a source/drain region 48 in the transistor region 16. Similar to the aforementioned light doping process, a patterned photoresist (not shown) could be formed on regions not undergoing doping process, and an ion implantation is performed by using the patterned photoresist as mask to implant n-type or p-type dopants into the substrate 12 adjacent to two sides of the spacer 46, thereby forming a source/drain region 48 in the transistor region 16.

It should be noted that the aforementioned source/drain region 48 could be fabricated by using selective epitaxial process, the order of the fabrication process could be rearranged or adjusted according to the demand of the product, and the number of the spacers and material utilized could also adjusted accordingly. For instance, either one of the silicon oxide layer 38, the silicon nitride layer 40, or the silicon oxide layer 46 formed during the spacer formation process could be omitted. Moreover, the main spacer composed of silicon oxide layer 38 and the silicon nitride layer 40 could be fabricated before or after the formation of the lightly doped source/drain 34; the main spacer composed of silicon oxide layer 38 and the silicon nitride layer 40 and the source/drain region could be formed before removing the spacer and forming the lightly doped source/drain 34; the spacers could be formed before an epitaxial layer is formed in the recess of the semiconductor substrate, and the outer most spacer is removed before forming the source/drain region; a recess could be formed in the semiconductor substrate to deposit an epitaxial layer after forming the lightly doped source/drain, and the spacer and source/drain region are formed thereafter. The aforementioned order for fabricating lightly doped source/drain, spacers, and source/drain region could all be adjusted according the demand of the product, which are all within the scope of the present invention.

After the source/drain region 48 is formed, a self-aligned silicide (salicide) process is performed. For instance, a film (not shown) composed of $SiO_2$, silicon nitride, or tetraethoxysilane (TEOS) is formed in the resistor region 14 and the transistor region 16, and an etching process is conducted to remove a portion of the film to form a salicide block (SAB) on regions not undergoing a salicide process. It should be noted that even though an extra photo-etching is conducted to remove the hard mask 30 on top of the polysilicon resistor 28 as shown in FIG. 4, the present invention could also omit the this extra etching process and remove the hard mask 30 as the above film is etching to form the salicide block. This prevents the utilization of an extra etching process to remove the hard mask 30 in the resistor region 14.

The salicide block is then used as a mask to deposit a metal layer (not shown) composed of tungsten, cobalt, titanium, nickel, platinum, palladium, or molybdenum over the surface of the substrate 12, the polysilicon resistor 28, the gate 32, and the spacer 46, and a rapid thermal annealing process is conducted to form a silicide 52 on top of the polysilicon resistor 28 and the substrate 12 adjacent to two sides of the spacer 46. Un-reacted metal layer remained from the salicide process is removed thereafter through a wet etching process and another rapid thermal annealing is performed to lower the resistance of the silicide 52.

Figure 6:
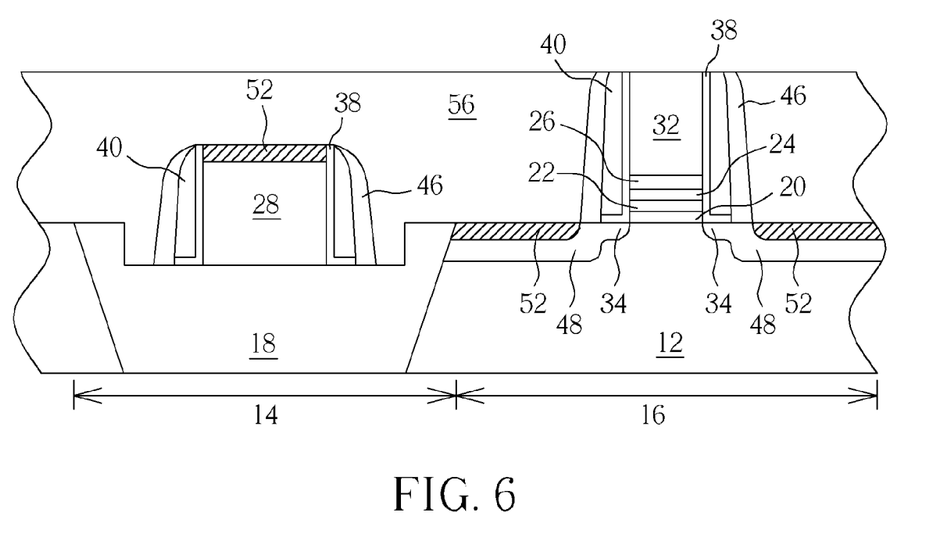

As shown in FIG. 6, an interlayer dielectric layer 56 composed of oxides is deposited on the polysilicon resistor 28 and the polysilicon gate 32. The interlayer dielectric layer 56 could be composed of nitrides, carbides, low dielectric constant material, or combination thereof. A chemical mechanical polishing (CMP) or a dry etching process is performed to planarize the interlayer dielectric layer 56 and remove a portion of the interlayer dielectric layer 56 and the hard mask 30 of the transistor region 16 until reaching and exposing the surface of the gate 32, such that the top of the gate 32 is substantially even with the surface of the interlayer dielectric layer 56. Preferably, the polysilicon resistor 28 is not exposed.

Figure 7:
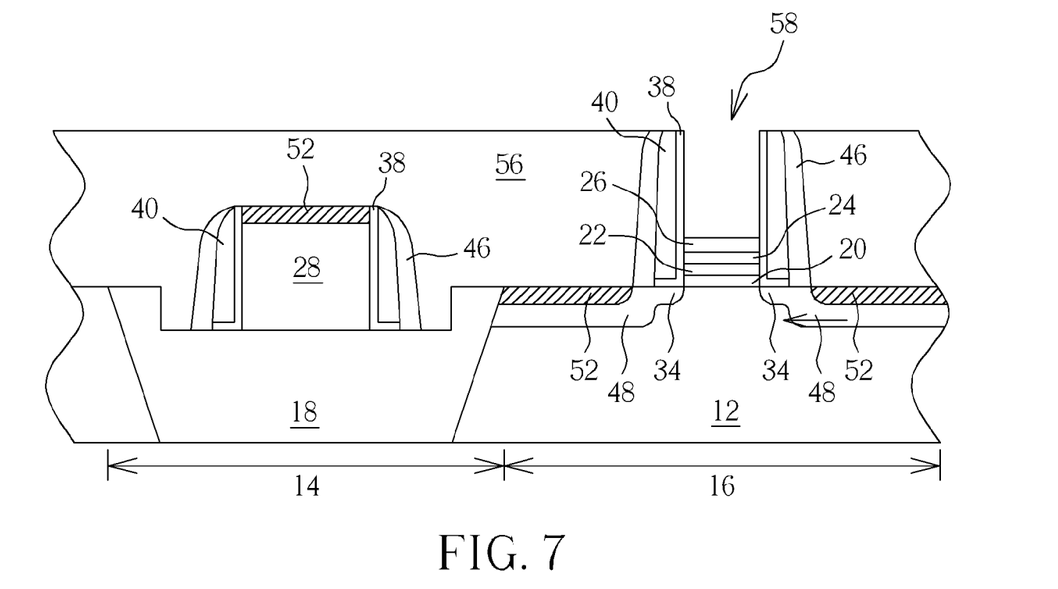

As shown in FIG. 7, a selective dry etching or wet etching is conducted by using ammonium hydroxide ($NH_4OH$) or tetramethylammonium hydroxide (TMAH) to mainly remove the polysilicon gate 32 disposed in the transistor region 16. As the etchant used in this process has a high selectivity to dielectric material, the interlayer dielectric layer 56 is not etched substantially. In this embodiment, the etching process preferably forms an opening 58 in the transistor region 16 while exposing the metal layer 26 underneath.

Figure 8:
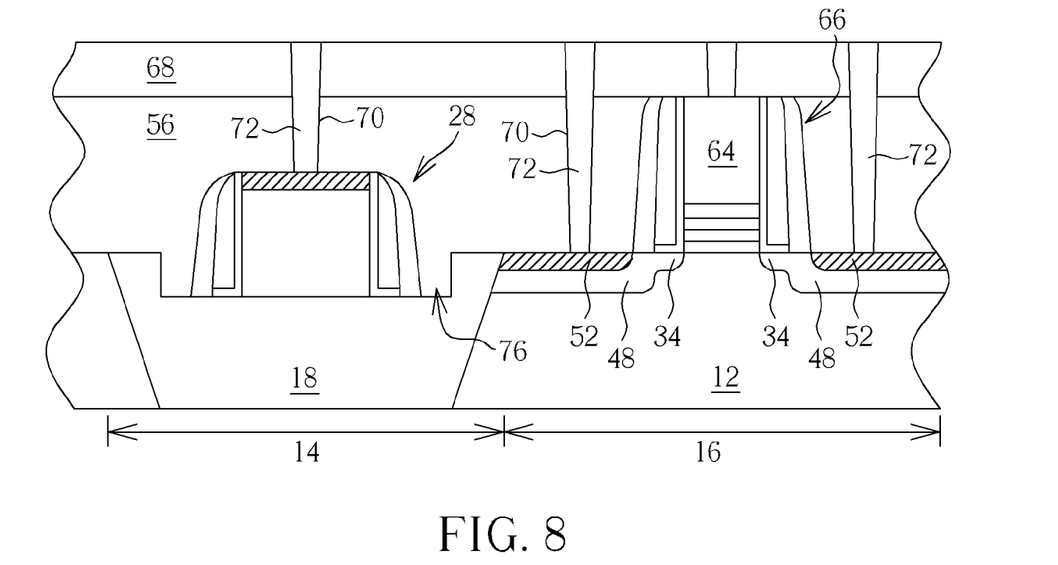

As shown in FIG. 8, a conductive layer 64 composed of low resistance material is deposited on the interlayer dielectric layer 56 and into the opening 58. The conductive layer 64 is preferably composed of Al, W, TiAl or CoWP. Another chemical mechanical polishing process is then performed to remove a portion of the conductive layer 64 until reaching the interlayer dielectric layer 56 such that the top of the conductive layer 64 is even with the surface of the interlayer dielectric layer 56, thereby forming a transistor with metal gate 66 in the transistor region 16. Next, a contact plug fabrication is performed by first forming another dielectric layer 68 on the resistor region 14 and the transistor region 16, and an etching is conducted by using a patterned photoresist (not shown) as mask to form a plurality of contact vias 70 in the dielectric layer 68 and interlayer dielectric layer 56 while exposing the silicide 52 of the resistor region 14 and the silicide 52 and conductive layer 64 of the transistor region 16. A metal composed of tungsten or other conductive material is then deposited in the contact vias 70 to form a plurality of contact plugs 72 connecting the polysilicon resistor 28 and the metal gate 66. This completes the fabrication of integrating a polysilicon resistor 28 and a transistor with metal gate 66 according to a preferred embodiment of the present invention.

Figure 9:
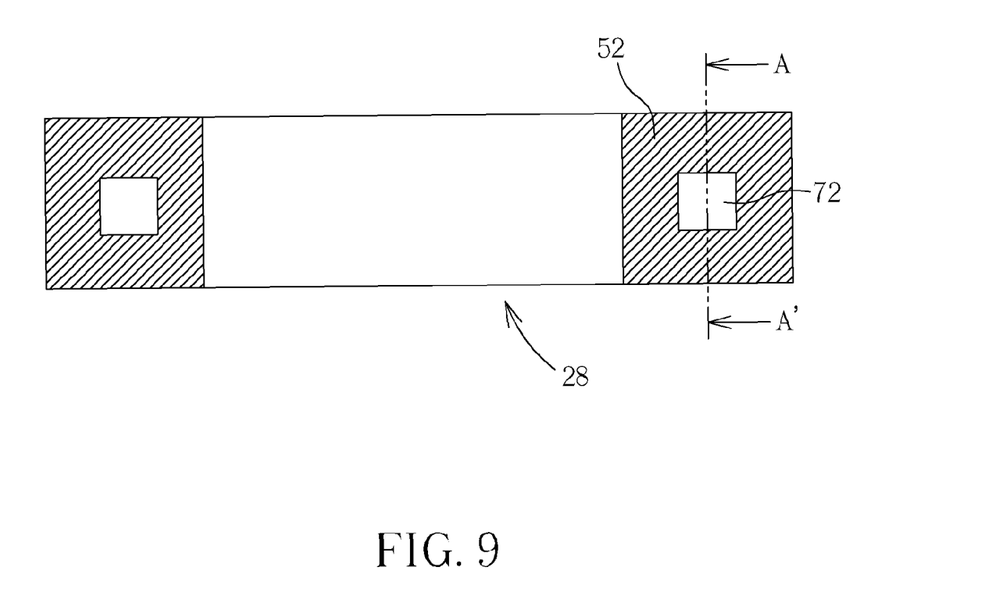
FIG. 9 illustrates a top view of a polysilicon resistor according to a preferred embodiment of the present invention.

It should be noted that as the silicide 52 is preferably formed on two ends of the polysilicon resistor 28, the contact plugs 72 are preferably connected to two ends of the resistor 28. Referring to FIG. 9, FIG. 9 illustrates a top view of a polysilicon resistor 28 according to a preferred embodiment of the present invention, while the polysilicon resistor 28 shown FIG. 8 is a preferred cross-sectional view of the resistor 28 of FIG. 9 along the sectional line AA'. As shown in the figures, the silicide 52 is preferably formed on two ends of the polysilicon resistor 28, such that during the salicide process, a salicide block is formed on region of the resistor 28 not intended to form any silicide (such as the central region of the resistor 28 shown in FIG. 9), and silicides 52 and contact plugs 72 are formed thereafter.

Referring back to the structure shown in FIG. 8, an integrated structure having a resistor and a transistor with metal gate is disclosed. For instance, the structure preferably includes a substrate 12, a shallow trench isolation 18 disposed in the resistor region 14 of the substrate 12, a tank 76 formed in the shallow trench isolation 18, a resistor 28 disposed in the tank 76 of the shallow trench isolation 18 and a transistor with metal gate 66 disposed in the transistor region 16. As the resistor 28 is disposed in the tank 76, which is further formed on surface of the shallow trench isolation 18, the height of the resistor 28 is substantially lower than the height of the metal gate 66 in the transistor region 16.

In this embodiment, the resistor 28 is composed of undoped polysilicon material or polysilicon containing n+ or p+ dopants, or other metals, and the metal gate 66 of the transistor is preferably composed of a conductive layer 64, a metal layer 26, a cap layer 24 and a high-k dielectric layer 22. Despite the metal layer 26 in this embodiment is formed between the conductive layer 64 and the cap layer 24, a metal layer with different pattern could be fabricated by a different approach. For instance, as the polysilicon gate 32 is removed in FIG. 7, the metal layer 26 could be simultaneously removed with the polysilicon gate 32, and another work-function metal layer and conductive layer are deposited thereafter. In this case, the later deposited metal layer would reveal a substantially U-shaped profile and would be formed on the sidewall of the opening 58 while surrounding the entire conductive layer 64. This structure is also within the scope of the present invention.

Figure 10:
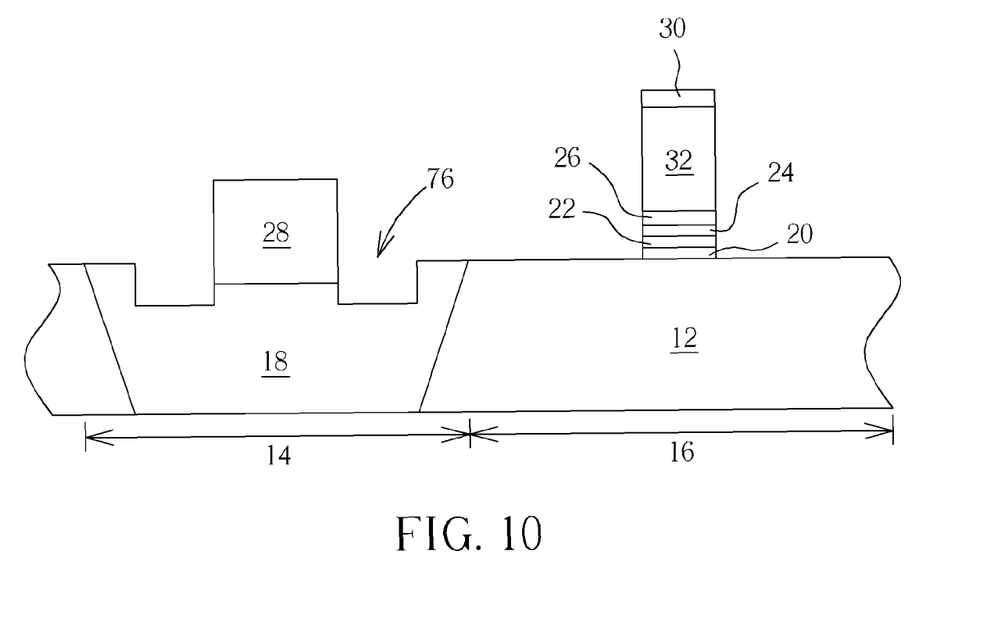
FIGS. 10-13 illustrate other embodiments of the integrated structure having a polysilicon resistor and a transistor with metal gate.

Referring to FIGS. 10-13, FIGS. 10-13 illustrate other embodiments of the integrated structure having resistor 28 and a transistor with metal gate 66. As shown in FIG. 10, as another etching is used to remove the hard mask 30 from the top surface of the polysilicon resistor 28, a portion of the shallow trench isolation 18 could be removed simultaneously, such that the surface of the shallow trench isolation 18 contacting the resistor 28 is not even with the shallow trench isolation 18 surrounding the resistor 28. In this embodiment, the surface of the shallow trench isolation accommodating the resistor 28 is substantially higher than the shallow trench isolation 18 surrounding the resistor 28.

Figure 11:
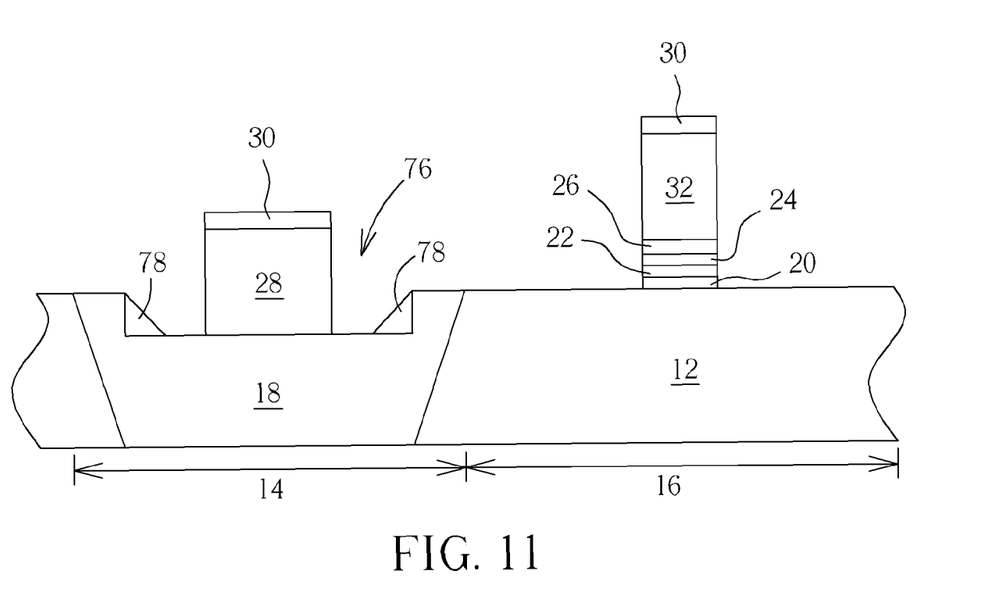

As shown in FIG. 11, a plurality of substantially triangular polysilicon spacers could be formed in the corners of the tank 76 while a portion of the polysilicon layer is removed for forming the polysilicon resistor 28 and the gate 32, which is also within the scope of the present invention.

Figure 12:
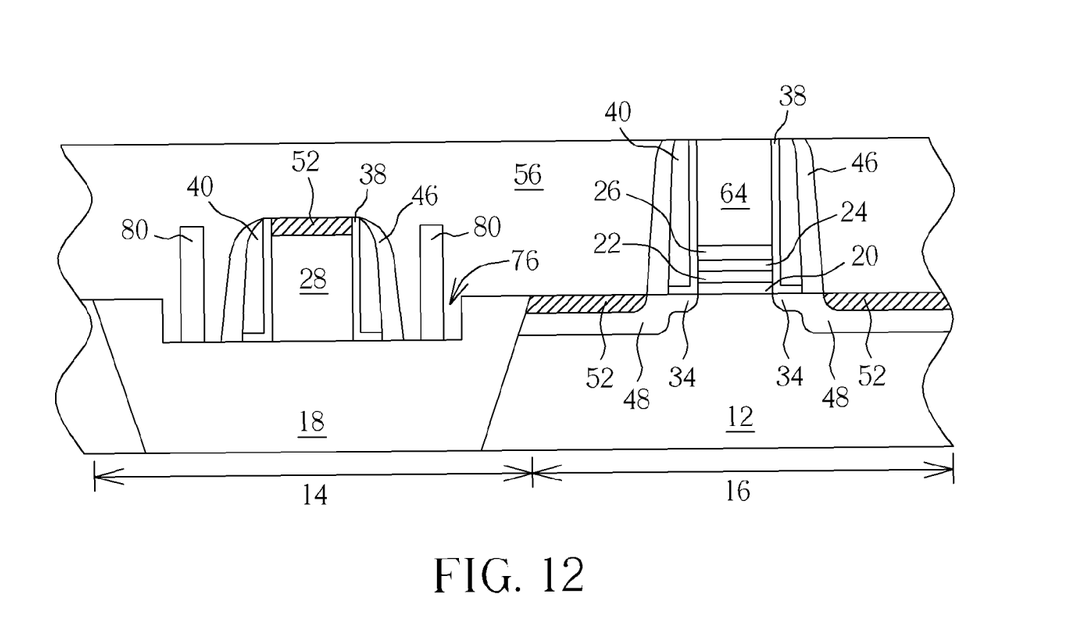
Figure 13:
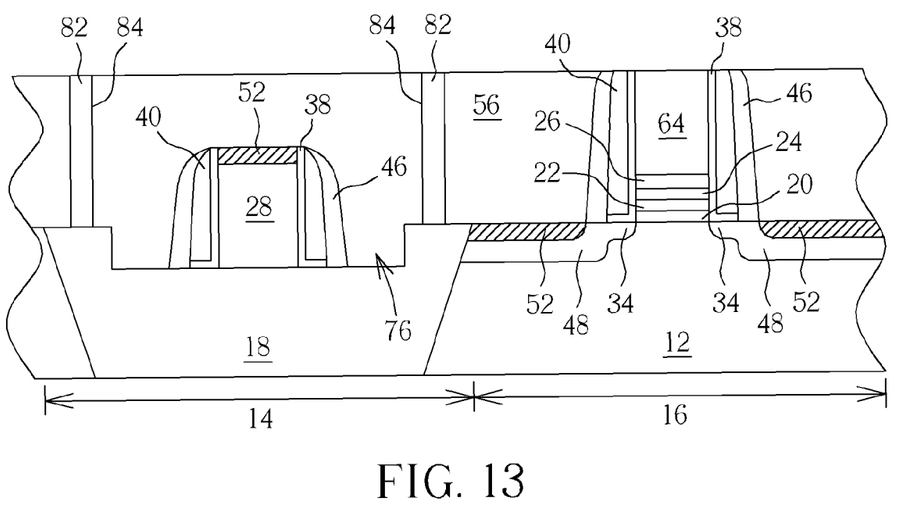

As shown in FIG. 12, as the polysilicon layer is etched and patterned to form the patterned polysilicon resistor 28, a plurality of dummy polysilicon pattern 80 could be formed on surface of the shallow trench isolation 18 and within the tank 76 simultaneously. Similarly, as shown in FIG. 13, a plurality of vias 84 could be formed in the interlayer dielectric layer 56 of the resistor region 14 after the polysilicon gate 32 is removed, and a conductive material substantially the same or different from the conductive layer 64 is deposited in the vias 84 to form a plurality of dummy conductive patterns 82. Preferably, the dummy polysilicon pattern 80 shown in FIG. 12 is disposed on the surface of the shallow trench isolation within the tank 76, whereas the dummy conductive pattern 82 is disposed on surface of the shallow trench isolation 18 outside the tank 76. These two dummy patterns 80 and 82 are preferably utilized as supporting pillars for the polysilicon resistor 28 to prevent damage of the resistor structure from collapsing of the interlayer dielectric layer 56 caused by dishing phenomenon.

Those skilled in the art will readily observe that numerous modifications and alterations of the device and method may be made while retaining the teachings of the invention.

What is claimed is:

1. A transistor with metal gate, comprising:
   a substrate having a transistor region and a resistor region;
   a shallow trench isolation disposed in the substrate of the resistor region;
   a tank formed in the shallow trench isolation of the resistor region;
   a resistor disposed in the tank of the shallow trench isolation; and
   a metal gate transistor disposed on the substrate of the transistor region.

2. The transistor with metal gate of claim 1, wherein the resistor is a polysilicon resistor.

3. The transistor with metal gate of claim 1, further comprising a plurality of dummy patterns disposed in the resistor region.

4. The transistor with metal gate of claim 3, wherein the dummy patterns comprise dummy polysilicon patterns or dummy conductive patterns.

5. The transistor with metal gate of claim 3, wherein the dummy patterns are disposed in the tank or on surface of the shallow trench isolation outside the tank.

6. The transistor with metal gate of claim 1, further comprising a plurality of polysilicon spacers disposed in the corners of the tank.

7. The transistor with metal gate of claim 1, wherein the surface of the shallow trench isolation contacting the resistor is not even with the shallow trench isolation surrounding the resistor.

8. The transistor with metal gate of claim 1, further comprising a plurality of contact plugs connecting the resistor and the metal gate transistor.

* * * * *